United States Patent [19]

Montgomery

[11] 3,882,807

[45] May 13, 1975

[54] METHOD OF SEPARATING DUAL INLINE PACKAGES FROM A STRIP

[75] Inventor: Robert Matteson Montgomery, Sherman, Tex.

[73] Assignee: Texas Instruments Incorporated, Dallas, Tex.

[22] Filed: Apr. 8, 1974

[21] Appl. No.: 458,943

[52] U.S. Cl. .................. 113/119; 29/626; 225/105

[51] Int. Cl. .................................... B21d 53/00

[58] Field of Search ....... 225/1, 103, 104, 105, 101, 225/2, 3, 4, 5, 6; 113/119; 29/203 DT, 626

[56] References Cited

UNITED STATES PATENTS

| | | | |
|---|---|---|---|
| 2,295,052 | 9/1942 | Rosa | 225/104 |
| 2,331,351 | 10/1943 | Seeley | 225/105 |
| 3,515,326 | 6/1970 | Saito et al. | 225/104 X |
| 3,735,017 | 5/1973 | Manning | 113/119 X |
| 3,846,906 | 11/1974 | Ivanovic | 29/203 DT X |

*Primary Examiner*—J. M. Meister
*Assistant Examiner*—Fred A. Silverburg
*Attorney, Agent, or Firm*—Harold Levine; James T. Comfort; James O. Dixon

[57] ABSTRACT

The disclosure relates to a system and method of separating dual inline packages (DIP) from each other which have been formed on a strip. The separation takes placed by separating the lead frames of adjacent packages at precise locations and without burrs or the like at the point of separation. This is provided by replacing the prior art shearing techniques with a punch and anvil apparatus wherein the reduced cross-section regions between sets of adjacent lead frames are positioned between a pair of nests, there being a pair of nests for each adjacent pair of lead frames. The lead frames are clamped tightly in the nest or form anvil and the leads which extend into the space between adjacent anvils are then severed by application of a punch thereto which is of smaller width than the distance between adjacent anvils and the thickness of the lead frame. The punch will push the lead frame leads downwardly, pulling the leads of adjacent lead frames apart until the leads rupture or fracture, this rupture taking place at the most reduced cross section region, which is the point of least resistance, and always in this region. In addition, the leads are bent downwardly between the punch and anvil to provide the standard DIP shape.

In one form the punch has a pointed tip formed by a pair of bottom edges which make an acute angle with the horizontal or plane of the lead frame. This angle is not critical but the most effective angle may vary dependent upon the lead frame material. For KOVAR, an angle of about 15° provides excellent results. The punch may also be rounded or flat in form.

2 Claims, 5 Drawing Figures

METHOD OF SEPARATING DUAL INLINE PACKAGES FROM A STRIP

Figure 1A:
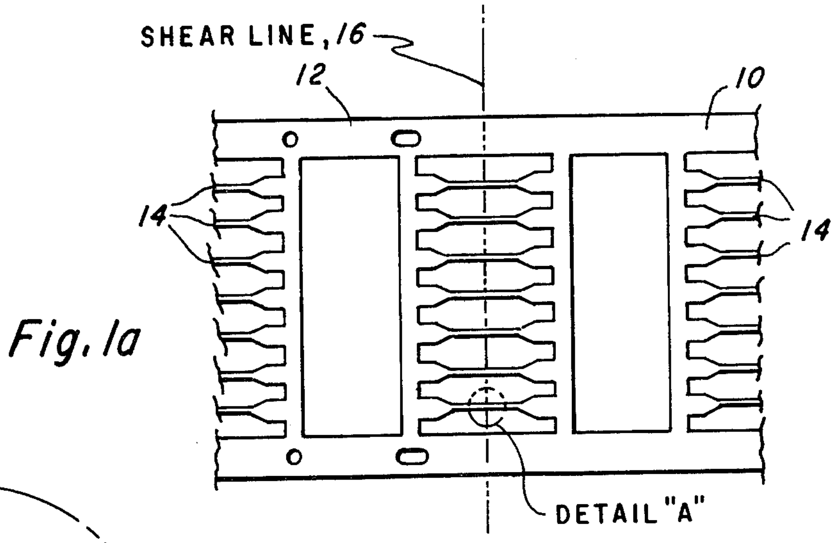

One of the more popular packages for integrated circuits presently is the so-called dual inline package (DIP), especially for economy devices wherein the active semiconductor element is protected by being encapsulated and hermetically sealed within a molded plastic enclosure. These packages are ordinarily quite small, about one-fourth of an inch × three-fourths of an inch to 1¼ inches × one-fourth inch thick and require a fairly large number of external leads, this number usually being on the order of 10 to 24 which must fit into matching sockets or openings in a printed circuit board. Thus, the tolerance on dimensions, especially on lead size and spacing must be quite small.

In the manufacture of integrated circuits in dual inline plastic packages, one process begins with a long continuous ladder-like assembly of metal lead frames which is stamped or cut from a ribbon or tape of metal. The semiconductor element is affixed to a central mounting pad in each lead frame and then fine gold wires are bonded between certain areas of the semiconductor element and the various leads of the lead frame. Thereafter, the active element is encapsulated in plastic by an injection or transfer molding process. Subsequent to encapsulation, the devices are separated into individual units by cutting away the portions of the lead frame (filets and rails) which served only for support and positioning of the leads during the manufacturing process but which would cause electrical short circuiting between the leads if left in place. At the same time, the leads may be bent into position to provide a "plug-in" unit. Dimensions of the lead frames can be held within acceptable tolerances in the manufacture of the lead frames "ladder" itself. However, various parts of the lead frames may become bent or distorted during the chip and wire bonding and encapsulating operations because they are made from inexpensive material of a thickness on the order of 0.010 inches. Thus it is often difficult to correctly position the lead frames for the final shearing operations thereon so that the final dimensions of the device are within desired tolerance. It is especially difficult to shear the leads to lengths within the prescribed tolerance of ±0.005 inches. Often the shearing operation took place beyond the area of minimum cross section so that the area of chamfer for insertion into sockets was removed at one end and the other end was too long. Also, when the shear blades started to become dull, the shearing operation would leave burrs at the ends of the leads even in the necked down or reduced cross section portion, to leave a truncated point with a burr, adding to tool and die maintenance and part rejection.

In accordance with the present invention the above problems of the prior art are overcome and there is provided a system and method of separating leads of adjacent lead frames accurately, without burrs and in proper DIP configuration. Briefly, this is accomplished by replacing the prior art shearing techniques with a punch and anvil apparatus wherein the reduced cross-section regions between sets of adjacent lead frames are positioned between a pair of nests, there being a pair of nests for each adjacent pair of lead frames. The lead frames are held in the nest or form anvil and the leads, which extend into the space between adjacent anvils are then severed by application of a punch thereto which is of smaller width than the distance between adjacent anvils and the thickness of the lead frame. The punch will push the lead frame leads downwardly, pulling the leads of adjacent lead frames apart until the leads rupture or fracture, this rupture taking place at the most reduced cross-section region, which is the point of least resistance, and always in this region. In addition, the leads are bent downwardly between the punch and anvil to provide the standard DIP shape.

The punch may have a pointed tip formed by a pair of bottom edges which make an acute angle with the horizontal or plane of the lead frame. This angle is not critical. For KOVAR, an angle of about 15° provides excellent results. In practice a round and even a flat punch have proved satisfactory. The leads of adjacent devices in the lead frame ladder are separated by fracture indention across an anvil. Because of a 0.010 inch long narrowed or necked down region, the dividing line between the leads of the adjacent devices, the leads only separate within tolerance, even when the punch does not strike the exact area where fracture is desired.

It is an object of the present invention to provide semiconductor circuit devices which have been assembled and encapsulated on a single piece multiple unit lead frame strip wherein the finished length and shape of the individual device leads can be consistently and accurately controlled.

It is a further object of this invention to provide a method and apparatus for severing adjacent lead frames in a strip at a predetermined precise location by forcing a rupture at necked down coupling regions of adjacent lead frames.

It is a yet further object of this invention to provide a system for severing connected leads in adjacent lead frames whereby the lead frames are secured in an anvil and a punch causes rupture in a necked down region in the leads.

Figure 1B:
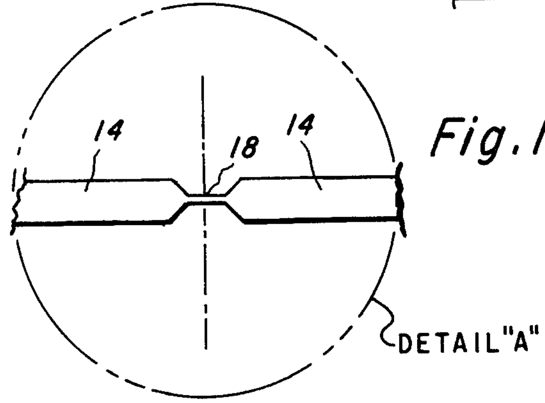

The above objects and still further objects of the invention will immediately become apparent to those skilled in the art after consideration of the following preferred embodiment thereof, which is provided by way of example and not by way of limitation, wherein:

FIG. 1*a* is a diagram of a portion of a lead frame strip in preparation for separation in accordance with the method and apparatus of the present invention;

FIG. 1*b* is an enlarged view of a lead and necked down region (Detail A) connecting adjacent lead frames of FIG. 1*a;*

Figure 2A:
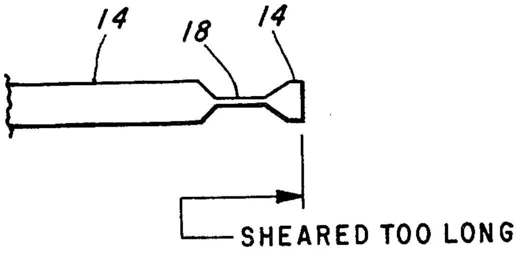
Figure 2B:
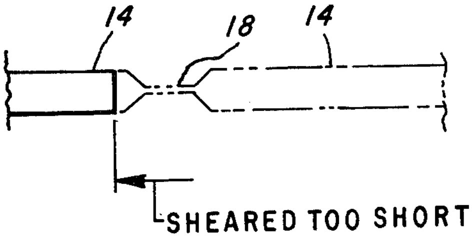

FIG. 2*a* is a diagram of a lead which is improperly sheared too long;

FIG. 2*b* is a diagram of a lead which is improperly sheared too short; and

Figure 3:
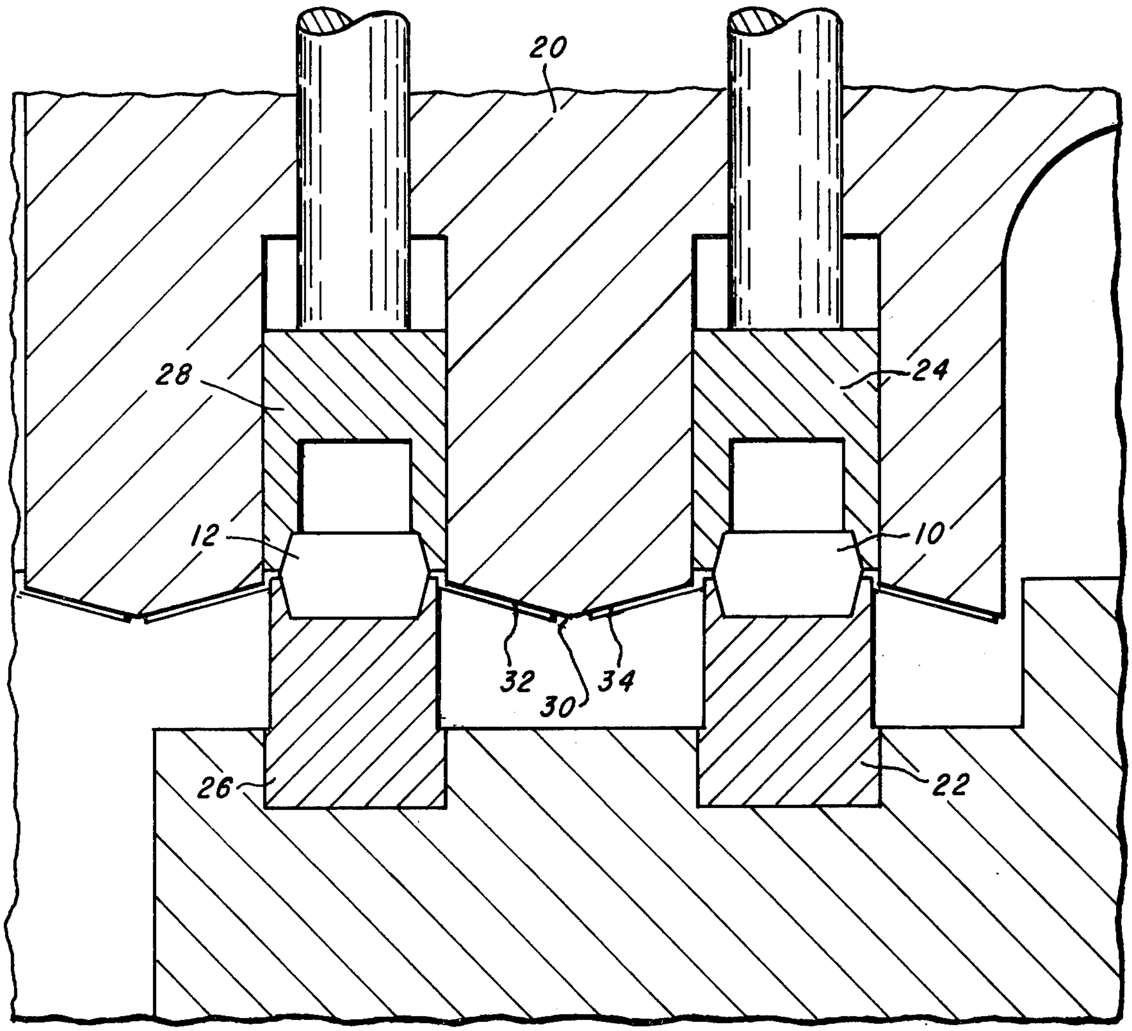

FIG. 3 is a schematic diagram of apparatus for separating adjacent lead frames in accordance with the present invention.

Turning now to FIG. 1*a* there is shown a pair of lead frames 10, 12 on which have been mounted semiconductor devices which are properly connected to leads 14 and encapsulated, all in well-known manner. The lead frame is formed from KOVAR having a 0.010 inch thickness though it should be understood that other appropriate materials can be used as is well-known in the art. It is understood that though only two lead frames are shown, a strip of any predetermined number can be used. As can be seen in FIG. 1*a*, adjacent lead frames are interconnected along the "shear line" 16 which is a region of necked down or reduced cross section 18 as best shown in FIG. 1*b* in the region between leads 14. It is desired to fracture the leads along shear line 16 in the necked down region 18 and preferably in the middle thereof.

In accordance with prior art shearing techniques, shearing was often off center and therefore provided leads that were too long as in FIG. 2*a* or too short as in FIG. 2*b*. Also, even when shears took place along the shear line 16, there were often burrs remaining at the sheared edges. Also, after shearing, the leads 14 still had to be bent into the standard DIP configuration.

In accordance with the present invention, shearing is replaced by punch 20, a form anvil 22 and a clamp 24 as shown in FIG. 3. In one embodiment, a strip of lead frames is positioned in the apparatus with the lead frame 10 secured between the form anvil 22 and clamp 24 and the lead frame 12 secured between the form anvil 26 and the clamp 28. The punch 20 is then moved downwardly so that the point 30 of the punch 20 impinges somewhere in the region but not necessarily exactly on the necked down area 18 between the leads 14 as shown in FIG. 1*b*. The punch 20 continues downwardly until rupture takes place, this being in the region 18 and at about the center or line 16 as shown in FIG. 1*b*. This is the result of causing a high stress point to exist until the leads fracture or pull apart.

As stated above, the width between adjacent anvils is slightly greater than the width of the punch 20 and twice the width of the lead frames so that the fractured leads will follow the punch downwardly between punch and anvil to form about a 90° bend in the leads and provide the standard DIP configuration. The rupture takes place in the necked down region 18 even if the punch does not strike directly on this area since this is the most fragile area. Since the length of the necked down region is held to twice the ±lead length tolerance, for example 0.010 in. for a lead length tolerance of ±0.005 in., the lead lengths will always be within length tolerance when rupture takes place within the necked down area 18.

In the described embodiment, the angle of the sides 32 and 34 forming the point 30 of the punch 20 is not critical. For a KOVAR lead frame, about a 15° angle with the plane of the lead frames has been used. In other embodiments a rounded or a flat punch have been used with success.

It can be seen that there has been provided apparatus and method for severing leads of adjacent lead frames on a strip without the problems of the prior art as enumerated above.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of severing leads of adjacent lead frames which comprises the steps of:

a. providing at least a pair of adjacent lead frames on a ladder-like assembly, each lead frame having a plurality of leads of an essentially uniform thickness, the corresponding opposing leads of said adjacent lead frames being connected together through a a reduced-width section of said leads located essentially midway between the centerlines of said adjacent lead frames;

b. securing said pair of adjacent lead frames between form anvils and clamps leaving said opposing leads accessible; and c. applying a force concurrently to all of said opposing leads in the region of said reduced-width section in a direction generally normal to the common plane of said adjacent lead frames until said leads rupture.

2. A method as set forth in claim 1 wherein said force is applied through movement of a punch member against said leads and the movement of said punch member is continued after rupture of said leads to form a bend in said leads of about 90°.

* * * * *